(12) United States Patent
Numata et al.

(10) Patent No.: US 11,012,048 B2
(45) Date of Patent: May 18, 2021

(54) FILTER AND MULTIPLEXER

(71) Applicant: TAIYO YUDEN CO., LTD., Tokyo (JP)

(72) Inventors: Toshimasa Numata, Tokyo (JP); Hitoshi Ebihara, Tokyo (JP); Naoto Kobayashi, Tokyo (JP); Masayuki Kitajima, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 1 day.

(21) Appl. No.: 16/696,621

(22) Filed: Nov. 26, 2019

(65) Prior Publication Data

US 2020/0244246 A1   Jul. 30, 2020

(30) Foreign Application Priority Data

Jan. 30, 2019   (JP) .............................. JP2019-014854

(51) Int. Cl.
| | |
|---|---|
| *H03H 9/64* | (2006.01) |
| *H03H 9/25* | (2006.01) |
| *H03H 9/02* | (2006.01) |
| *H03H 9/145* | (2006.01) |
| *H03H 9/76* | (2006.01) |

(52) U.S. Cl.
CPC .... *H03H 9/02866* (2013.01); *H03H 9/02685* (2013.01); *H03H 9/145* (2013.01); *H03H 9/25* (2013.01); *H03H 9/6483* (2013.01); *H03H 9/6489* (2013.01); *H03H 9/76* (2013.01)

(58) Field of Classification Search
CPC ............................................... H03H 9/64–725
See application file for complete search history.

(56) References Cited

U.S. PATENT DOCUMENTS

| | | | |
|---|---|---|---|
| 6,351,197 B1 | 2/2002 | Selmeier et al. ............. | 333/195 |
| 8,362,852 B2 * | 1/2013 | Tanaka ................... | H03H 9/725 |
| | | | 333/133 |

(Continued)

FOREIGN PATENT DOCUMENTS

| | | |
|---|---|---|
| JP | 2-250414 A | 10/1990 |
| JP | 2001-510950 A | 8/2001 |

(Continued)

*Primary Examiner* — Dean O Takaoka
*Assistant Examiner* — Alan Wong
(74) *Attorney, Agent, or Firm* — Stein IP, LLC

(57) ABSTRACT

A filter includes: a piezoelectric substrate; a first acoustic wave resonator located on the piezoelectric substrate and including a pair of first reflectors including first grating electrodes and a pair of first comb-shaped electrodes that is located between the first reflectors and includes first electrode fingers; and a second acoustic wave resonator that is connected in series or parallel with the first acoustic wave resonator, is located on the piezoelectric substrate, and includes a pair of second reflectors including second grating electrodes and a pair of second comb-shaped electrodes that is located between the second reflectors and includes second electrode fingers, an average value of duty ratios of the second grating electrodes being different from an average value of duty ratios of the first grating electrodes, an average value of pitches of the second electrode fingers being substantially equal to an average value of pitches of the first electrode fingers.

10 Claims, 9 Drawing Sheets

(56) References Cited

U.S. PATENT DOCUMENTS

| | | | |
|---|---|---|---|
| 8,502,621 B2* | 8/2013 | Uesaka | H03H 9/14547 |
| | | | 333/133 |
| 8,773,221 B2* | 7/2014 | Nakahashi | H03H 9/14594 |
| | | | 333/195 |
| 9,882,548 B2* | 1/2018 | Takamine | H03H 9/562 |
| 10,097,158 B2* | 10/2018 | Kaneda | H03H 9/6483 |
| 10,177,738 B2* | 1/2019 | Miyamoto | H03H 9/1071 |
| 2004/0135650 A1 | 7/2004 | Miura et al. | 333/133 |
| 2004/0226162 A1 | 11/2004 | Miura et al. | 29/594 |
| 2017/0331456 A1 | 11/2017 | Ono | |

FOREIGN PATENT DOCUMENTS

| | | |
|---|---|---|
| JP | 2004-186868 A | 7/2004 |
| JP | 2004-343359 A | 7/2004 |
| JP | 2016-82570 A | 5/2016 |
| JP | 2017-204743 A | 11/2017 |

* cited by examiner

… (1)

FILTER AND MULTIPLEXER

CROSS-REFERENCE TO RELATED APPLICATION

This application is based upon and claims the benefit of priority of the prior Japanese Patent Application No. 2019-014854, filed on Jan. 30, 2019, the entire contents of which are incorporated herein by reference.

FIELD

A certain aspect of the present invention relates to a filter and a multiplexer.

BACKGROUND

In surface acoustic wave resonators, an interdigital transducer (IDT) including a plurality of electrode fingers and reflectors are provided on a piezoelectric substrate. The reflectors reflect the acoustic wave excited by the IDT to confine the acoustic wave within the IDT. It has been known to connect surface acoustic wave resonators having different resonant frequencies or different antiresonant frequencies in series or in parallel as disclosed in, for example, Japanese Patent Application Publication Nos. 2001-510950, 2016-82570, and 2017-204743 (hereinafter, referred to as Patent Documents 1 through 3, respectively).

SUMMARY OF THE INVENTION

According to a first aspect of the present invention, there is provided a filter including; a piezoelectric substrate; a first acoustic wave resonator that is located on the piezoelectric substrate and includes a pair of first reflectors and a pair of first comb-shaped electrodes, the pair of first reflectors including a plurality of first grating electrodes, the pair of first comb-shaped electrodes being located between the pair of first reflectors and including a plurality of first electrode fingers; and a second acoustic wave resonator that is connected in series with or connected in parallel with the first acoustic wave resonator, is located on the piezoelectric substrate, and includes a pair of second reflectors and a pair of second comb-shaped electrodes, the pair of second reflectors including a plurality of second grating electrodes, an average value of duty ratios of the plurality of second grating electrodes being different from an average value of duty ratios of the plurality of first grating electrodes, the pair of second comb-shaped electrodes being located between the pair of second reflectors and including a plurality of second electrode fingers, an average value of pitches of the plurality of second electrode fingers being substantially equal to an average value of pitches of the plurality of first electrode fingers.

According to a second aspect of the present invention, there is provided a multiplexer including the above filter.

DETAILED DESCRIPTION

In the surface acoustic wave resonator, a spurious emission may occur.

Hereinafter, embodiments will be described with reference to the accompanying drawings.

First Embodiment

Figure 1A:
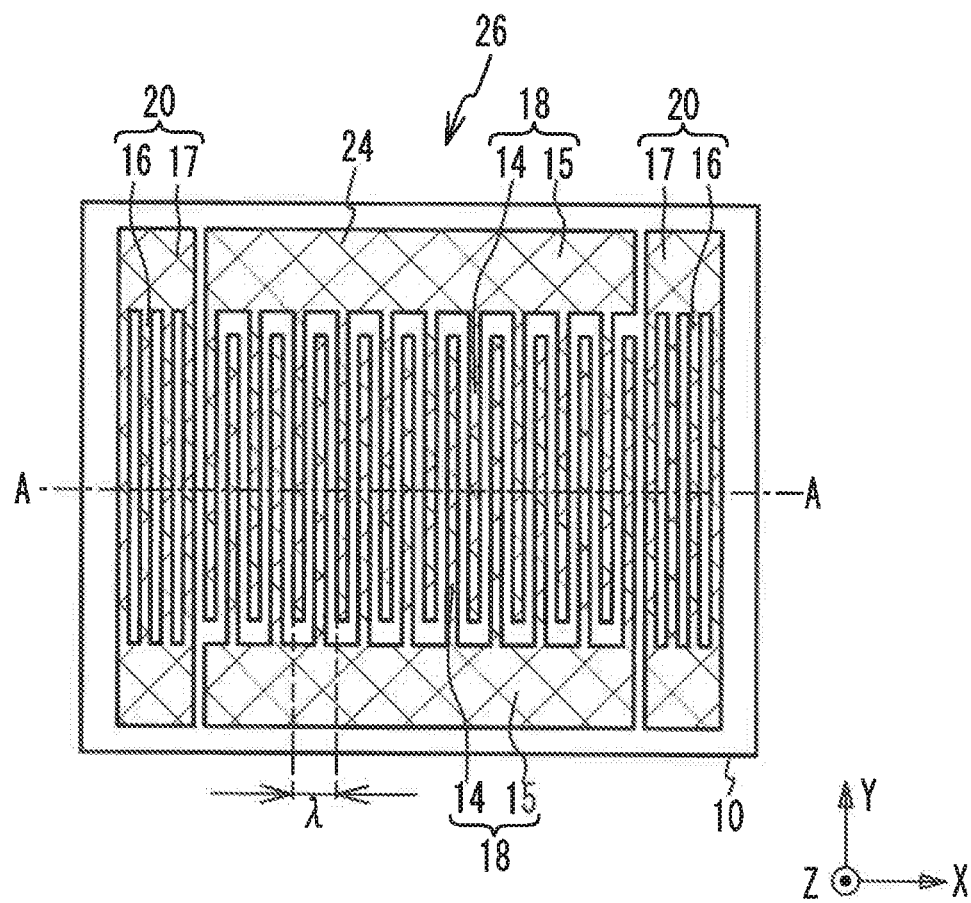
FIG. 1A is a plan view of an acoustic wave resonator in comparative examples and embodiments.
Figure 1B:
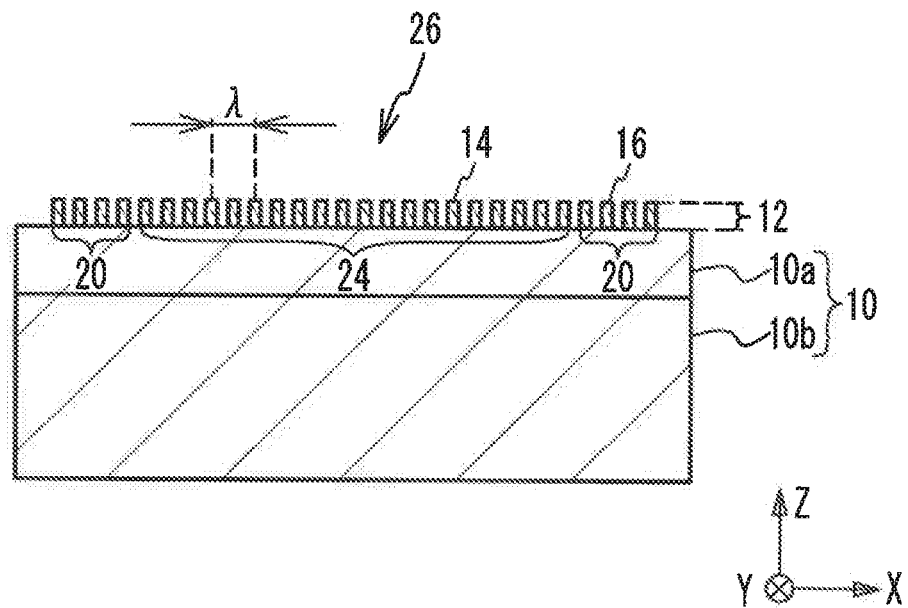
FIG. 1B is a cross-sectional view taken along line A-A in FIG. 1A.

FIG. 1A is a plan view of an acoustic wave resonator in comparative examples and embodiments, and FIG. 1B is a cross-sectional view taken along line A-A in FIG. 1A. The direction in which electrode fingers are arranged (the arrangement direction of the electrode fingers) is defined as an X direction, the direction in which the electrode fingers extend (the extension direction of the electrode fingers) is defined as a Y direction, and the direction normal to a piezoelectric substrate (the normal direction of the piezoelectric substrate) is defined as a Z direction. The X direction, the Y direction, and the Z direction do not necessarily correspond to the crystal orientations of the piezoelectric substrate. However, when the piezoelectric substrate is a rotated Y-cut X-propagation substrate, the X direction is the X-axis orientation of the crystal orientations.

As illustrated in FIG. 1A and FIG. 1B, a substrate 10 includes a support substrate 10b and a piezoelectric substrate 10a. The piezoelectric substrate 10a is bonded on the support substrate 10b. In a one-port acoustic wave resonator 26, an IDT 24 and reflectors 20 are formed on the piezoelectric substrate 10a. The IDT 24 and the reflectors 20 are formed of a metal film 12 formed on the piezoelectric substrate 10a. A pair of the reflectors 20 are located at both sides of the IDT 24 in the X direction.

The IDT 24 includes a pair of comb-shaped electrodes 18 facing each other. The comb-shaped electrode 18 includes a plurality of electrode fingers 14 and a bus bar 15 to which the electrode fingers 14 are coupled. A pair of the comb-shaped electrodes 18 is provided so as to face each other such that the electrode fingers 14 of one of the comb-shaped electrodes 18 and the electrode fingers 14 of the other of the comb-shaped electrodes 18 are alternately arranged in at least a part of the IDT 24. Each of the reflectors 20 includes a plurality of grating electrodes 16 and a bus bar 17 to which the grating electrodes 16 are coupled.

The acoustic wave excited by the electrode fingers 14 of a pair of the comb-shaped electrodes 18 propagates mainly in the X direction. The pitch of the electrode fingers 14 of one of a pair of the comb-shaped electrodes 18 is approximately equal to the wavelength λ of the acoustic wave. The reflectors 20 reflect the acoustic wave. Thus, the energy of the acoustic wave is confined in the IDT 24.

The piezoelectric substrate 10a is, for example, a lithium tantalate substrate, a lithium niobate substrate, or a crystal substrate, and is, for example, a rotated Y-cut X-propagation lithium tantalate substrate or a lithium niobate substrate. The support substrate 10b is, for example, a monocrystalline sapphire substrate, an alumina substrate, a spinel substrate, a crystal substrate, or a silicon substrate. An insulating film such as, but not limited to, a silicon oxide film or an aluminum nitride film may be provided between the piezoelectric substrate 10a and the support substrate 10b. The support substrate 10b is not necessarily provided.

The metal film 12 is, for example, an aluminum film, a copper film, or a molybdenum film. A metal film such as a titanium film or a chrome film may be provided between the aluminum film, the copper film, or the molybdenum film and the piezoelectric substrate 10a. The wavelength λ is, for example, 500 nm to 2500 nm, the widths in the X direction of the electrode finger 14 and the grating electrode 16 are, for example, 200 nm to 1500 nm, the film thickness of the metal film 12 is, for example, 50 nm to 500 nm, and the electrostatic capacitance of the acoustic wave resonator 26 is, for example, 0.1 pF to 10 pF. An insulating film functioning as a protective film or a temperature compensation film may be provided on the piezoelectric substrate 10a so as to cover the metal film 12.

Figure 2A:
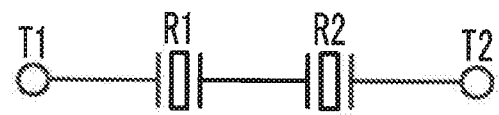
FIG. 2A and FIG. 2B are circuit diagrams of filters in accordance with a first embodiment.
Figure 2B:
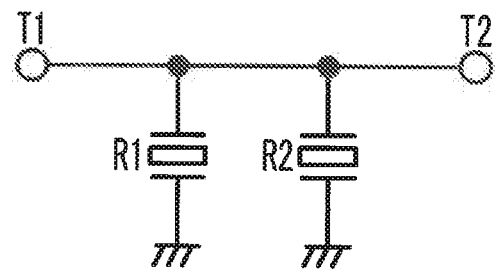

FIG. 2A and FIG. 2B are circuit diagrams of filters in accordance with a first embodiment. As illustrated in FIG. 2A, acoustic wave resonators R1 and R2 are connected in series between terminals T1 and T2. As illustrated in FIG. 2B, first ends of the acoustic wave resonators R1 and R2 are coupled to a series pathway between the terminals T1 and T2, and second ends of the acoustic wave resonators R1 and R2 are coupled to a ground.

Figure 3A:
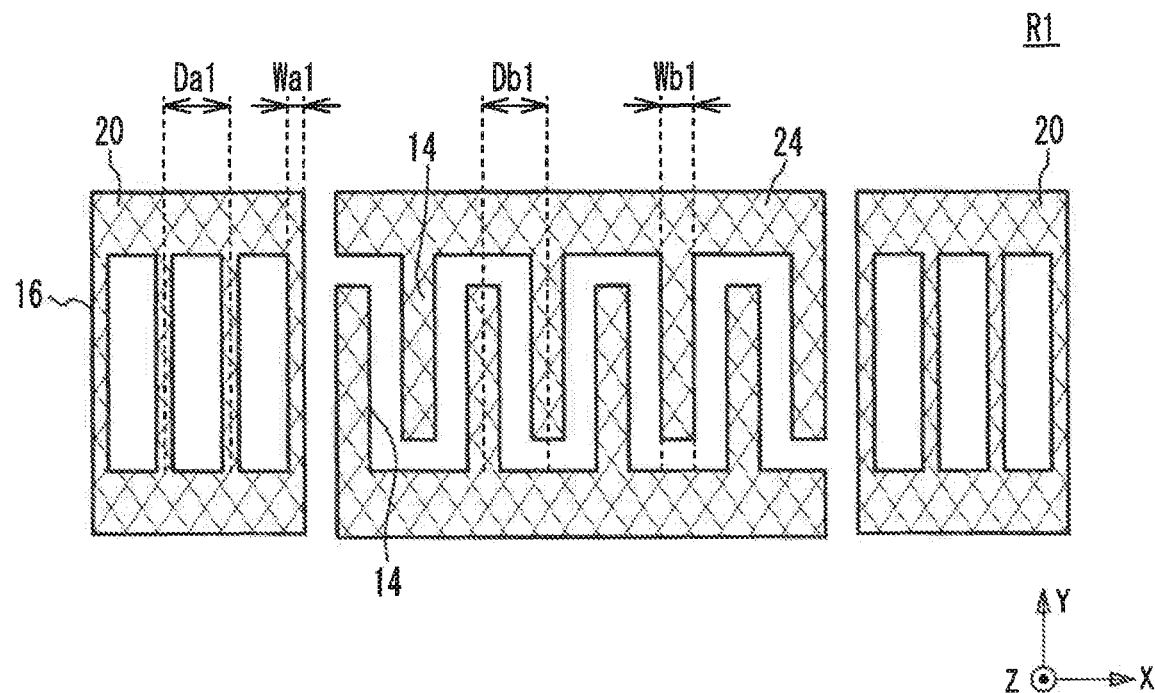
FIG. 3A and FIG. 3B are plan views of acoustic wave resonators in the first embodiment.
Figure 3B:
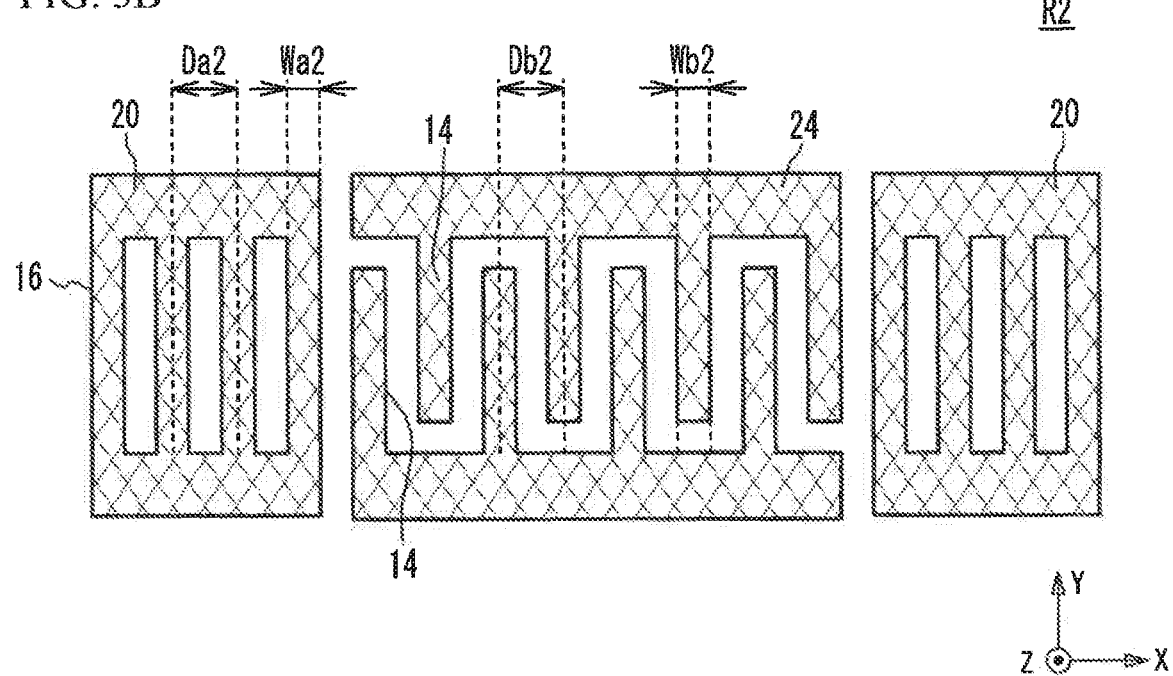

FIG. 3A and FIG. 3B are plan views of acoustic wave resonators in the first embodiment. As illustrated in FIG. 3A, the pitch of the grating electrodes 16 in the reflector 20 of the acoustic wave resonator R1 is represented by Da1, and the width in the X direction of the grating electrode 16 is represented by Wa1. The pitch of the electrode fingers 14 in the IDT 24 is represented by Db1, and the width in the X direction of the electrode finger 14 is represented by Wb1. The pitch Da1 in the reflector 20 is the distance between the centers of the adjacent grating electrodes 16, and the pitch Db1 in the IDT 24 is the distance between the centers of the adjacent electrode fingers 14. Here, 2×Db1 is substantially equal to the wavelength λ of the acoustic wave.

As illustrated in FIG. 3B, the pitch of the grating electrodes 16 in the reflector 20 of the acoustic wave resonator R2 is represented by Da2, and the width in the X direction of the grating electrode 16 is represented by Wa1. The pitch of the electrode fingers 14 in the IDT 24 is represented by Db2, and the width in the X direction of the electrode finger 14 is represented by Wb2.

The duty ratio in the reflector 20 of the acoustic wave resonator R1 is Pa1=Wa1/Da1, and the duty ratio in the IDT 24 of the acoustic wave resonator R1 is Pb1=Wb1/Db1. The duty ratio in the reflector 20 of the acoustic wave resonator R2 is Pa2=Wa2/Da2, and the duty ratio in the IDT 24 of the acoustic wave resonator R2 is Pb2=Wb2/Db2.

The pitch Db1 and the pitch Db2 in the IDTs 24 of the acoustic wave resonators R1 and R2 are substantially equal, and the duty ratio Pb1 and the duty ratio Pb2 in the IDTs 24 of the acoustic wave resonators R1 and R2 are substantially equal. Thus, the acoustic wave resonators R1 and R2 have substantially identical resonant frequencies and substantially identical antiresonant frequencies. The pitch Da1 and the pitch Da2 in the reflectors 20 of the acoustic wave resonators R1 and R2 are substantially equal. The duty ratio Pa1 and the duty ratio Pa2 differ from each other, and the duty ratio Pa1 is less than the duty ratio Pa2.

The IDT 24 excites a bulk wave in addition to the surface acoustic wave. In the acoustic wave resonator in which the piezoelectric substrate 10a is bonded on the support substrate 10b, a bulk wave is reflected by the boundary face between the piezoelectric substrate 10a and the support substrate 10b. The reflected bulk wave becomes a spurious emission. When the piezoelectric substrate 10a is thick, the bulk wave attenuates in the piezoelectric substrate 10a, and a spurious emission thereby becomes small. When the thickness of the piezoelectric substrate 10a is equal to or less than 20λ, a spurious emission due to the bulk wave becomes large.

Simulation 1

The transmission characteristics of the acoustic wave resonator were simulated by configuring the duty ratios of the grating electrodes 16 in the reflectors 20 of the acoustic wave resonators R1 and R2 to be different. Simulation conditions are as follows.

Piezoelectric substrate 10a: 42° rotated Y-cut X-propagation lithium tantalate substrate with a thickness of 20 μm Support substrate 10b: Sapphire substrate with a thickness of 500 μm Metal film 12: Titanium film with a film thickness of 50 nm and an aluminum film with a film thickness of 111 nm that are stacked in this order from the piezoelectric substrate 10a side Pitch in the IDT 24: 2×Db1=2×Db2=2.13 μm Number of pairs in the IDT 24: 152 pairs Aperture length in the IDT 24: 21λ

Duty ratio in the IDT 24: Pb1=Pb2=50%

Pitch in the reflector 20: 2×Da1=2×Da2=2.15 μm

Number of pairs in the reflector 20: 10 pairs

Duty ratio in the reflector 20: Pa1=48%, Pa1=53%

Figure 4:
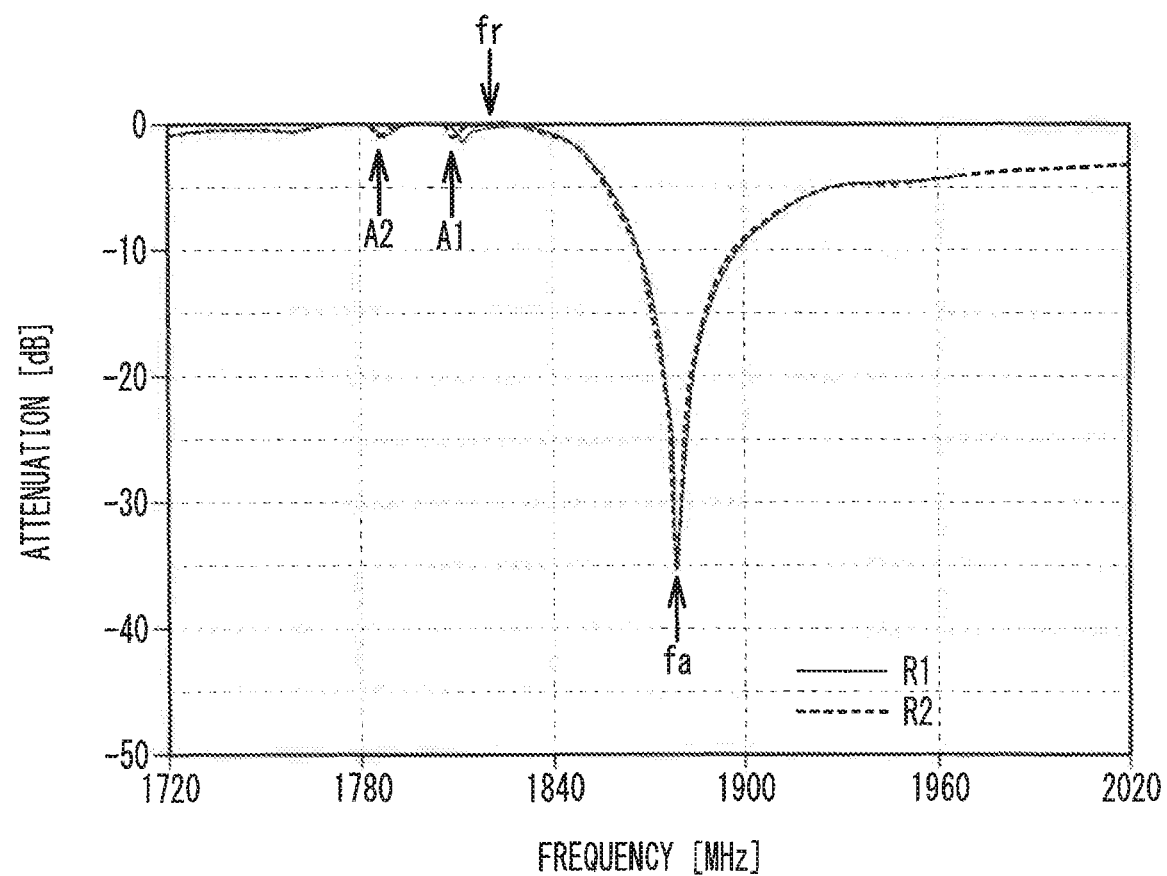
FIG. 4 illustrates transmission characteristics of acoustic wave resonators R1 and R2.

FIG. 4 illustrates the transmission characteristics of the acoustic wave resonators R1 and R2. As illustrated in FIG. 4, spurious emissions A1 and A2 are generated in a frequency band lower than the resonant frequency fr. The spurious emissions A1 and A2 are spurious emissions due to the bulk wave. The frequencies of the spurious emissions A1 and A2 of the acoustic wave resonator R2 of which the duty ratio in the reflector 20 is larger than the duty ratio in the reflector 20 of the acoustic wave resonator R1 are lower than the frequencies of the spurious emissions A1 and A2 of the acoustic wave resonator R1. As seen from above, the frequency at which a spurious emission is formed differs depending on the duty ratio in the reflector 20. The resonant frequencies fr of the acoustic wave resonators R1 and R2 are substantially equal, and the antiresonant frequencies fa of the acoustic wave resonators R1 and R2 are substantially equal.

Figure 5A:
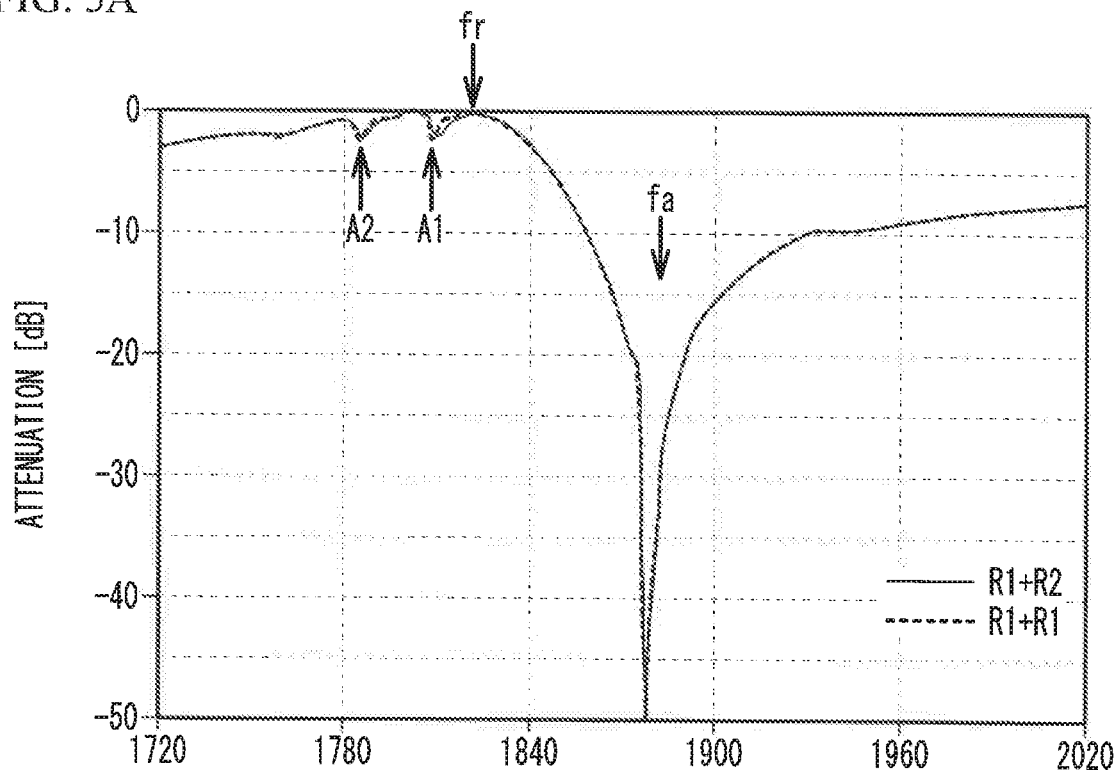
FIG. 5A and FIG. 5B illustrate transmission characteristics when the acoustic wave resonators are connected in series.
Figure 5B:
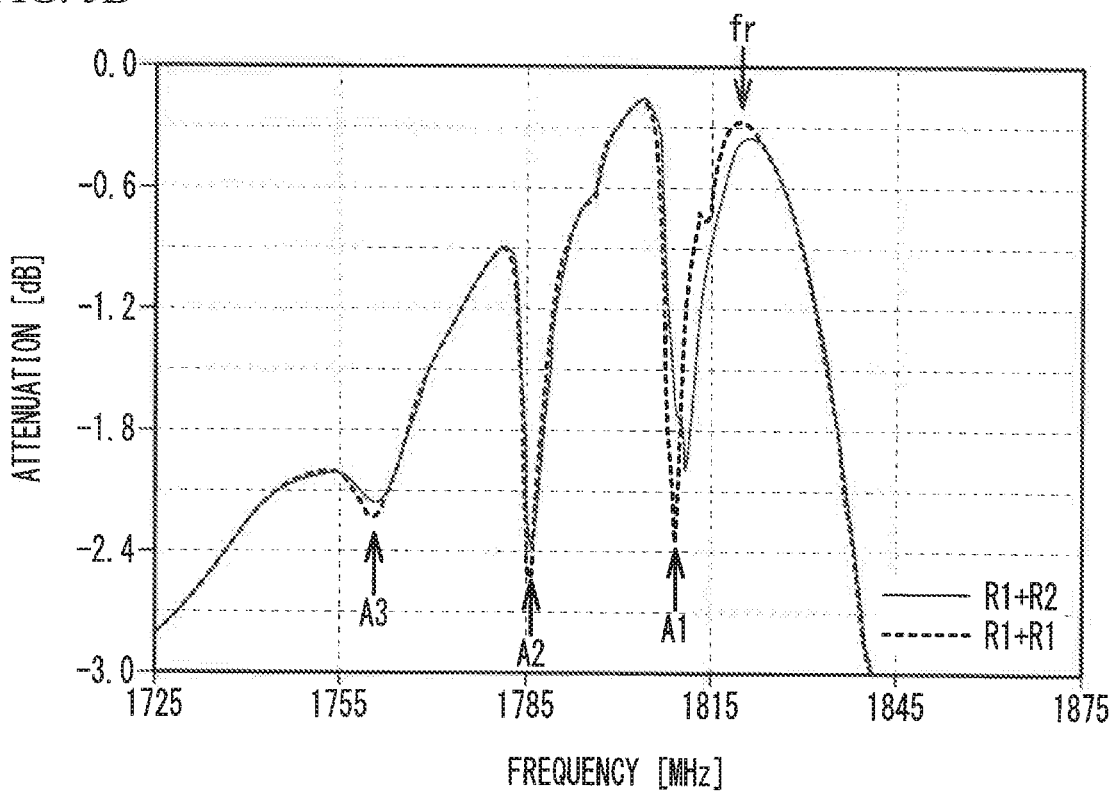

The transmission characteristics when two acoustic wave resonators are connected in series were simulated from the simulated transmission characteristics of the acoustic wave resonator. FIG. 5A and FIG. 5B illustrate transmission characteristics when acoustic wave resonators are connected in series. In FIG. 5A and FIG. 5B, R1+R1 indicates the case where two acoustic wave resonators R1 are connected in series, and R1+R2 indicates the case where the acoustic wave resonators R1 and R2 are connected in series.

As illustrated in FIG. 5A, when the acoustic wave resonators are connected in series, the attenuation at the antiresonant frequency fa is large. The spurious emissions A1 and A2 are formed in a frequency band lower than the resonant frequency.

As illustrated in FIG. 5B, spurious emissions A1 through A3 in R1+R2 are smaller than spurious emissions A1 through A3 in R1+R1, respectively. This is considered because the frequencies at which the spurious emissions A1 through A3 are formed differ between the acoustic wave resonators R1 and R2.

The frequency and the Q-value of a spurious emission of the acoustic wave resonator were simulated by varying the duty ratio Pa in the reflector 20. The simulation conditions are the same as those of the simulation in FIG. 4 except the duty ratio Pa in the reflector 20.

Figure 6A:
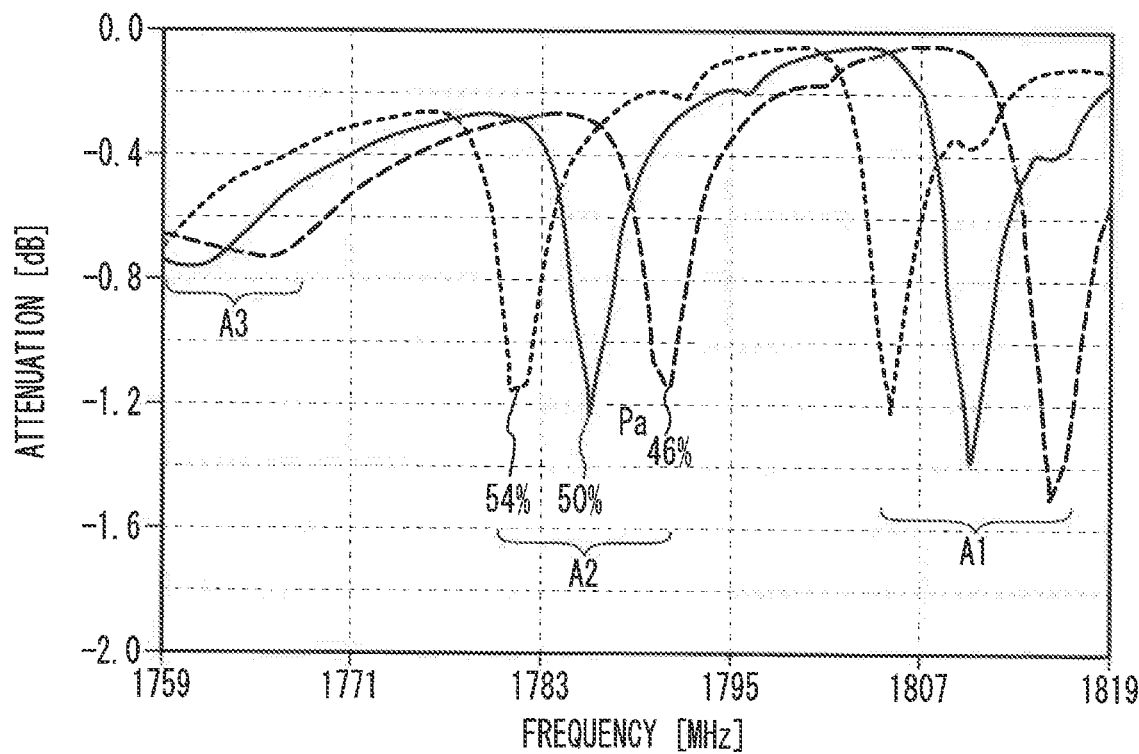
FIG. 6A illustrates spurious emissions in a simulation 1.
Figure 6B:
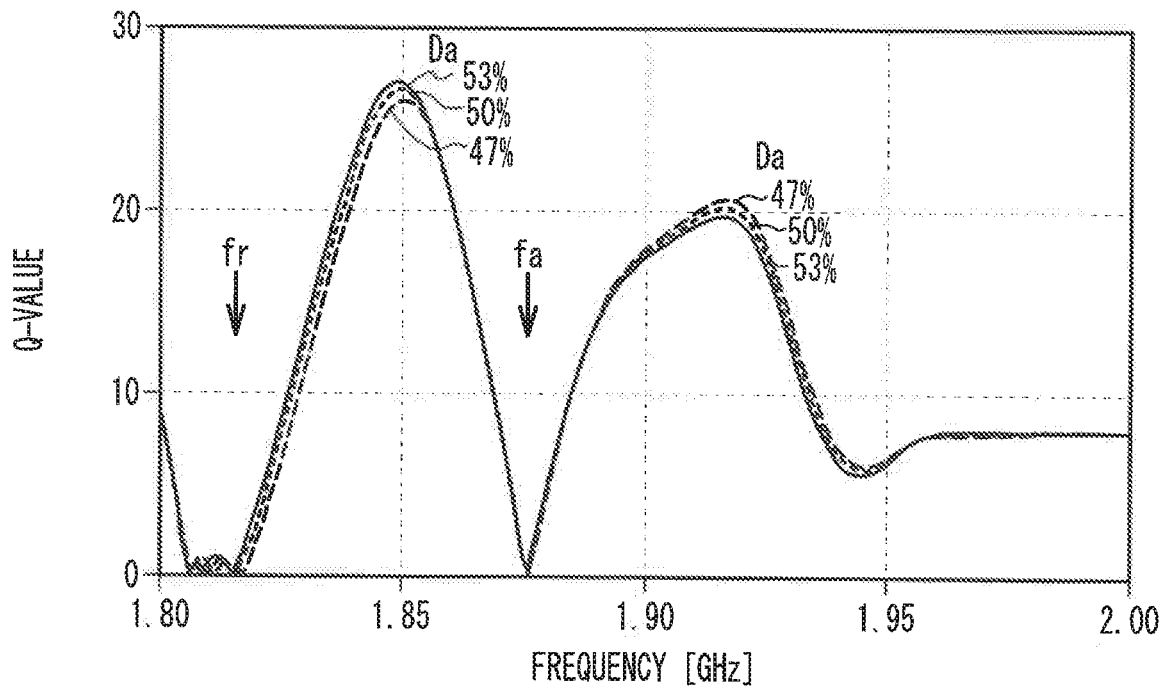
FIG. 6B is a graph of a Q-value versus frequency.

FIG. 6A illustrates spurious emissions in the simulation 1, and FIG. 6B is a graph of a Q-value versus frequency. As illustrated in FIG. 6A, as the duty ratio Pa increases, the frequencies of the spurious emissions A1 through A3 decrease. This is considered because the acoustic wave in the reflector 20 becomes slow when the duty ratio of the reflector 20 is large. When the duty ratio Pa is 50%, the period of the spurious emissions A1 through A3 is approximately 24 MHz. When the duty ratio Pa changes by 8%, the frequencies of the spurious emissions A1 through A3 change by approximately 10 MHz. Thus, when the duty ratio Pa changes by approximately 20%, the frequencies of the spurious emissions A1 through A3 change by approximately one period.

As illustrated in FIG. 6B, in the frequency band between the resonant frequency fr and the antiresonant frequency fa, as the duty ratio Pa increases, the Q-value increases. In the band of which the frequency is higher than the antiresonant frequency fa, as the duty ratio Pa decreases, the Q-value increases. As seen above, the Q-value in the frequency band lower than the antiresonant frequency fa is in the trade-off relationship with the Q-value in the frequency band higher the antiresonant frequency fa.

As illustrated in FIG. 6A, when the duty ratios in the eflectors 20 of the acoustic wave resonators R1 and R2 are appropriately selected, the spurious emission of the filter in which the acoustic wave resonators R1 and R2 are connected in series is reduced. It is considered that since the frequency at which a spurious emission is formed differs between the acoustic wave resonators R1 and R2, a spurious emission as the filter is reduced. Since the reason why a spurious emission is reduced is considered the above reason, a spurious emission is reduced also in the case where the acoustic wave resonators R1 and R2 are connected as illustrated in FIG. 2B.

Simulation 2

The acoustic wave resonators R1 and R2 were connected in series and in parallel as illustrated in FIG. 2A and FIG. 2B, and transmission characteristics between the terminals T1 and T2 were simulated.

Simulation conditions are as follows.
Series connection (FIG. 7A)
  First embodiment: Duty ratio Pa1=48%, Pa2=53%
  First comparative example: Duty ratio Pa1=Pa2=48%
Parallel connection (FIG. 7B)
  First embodiment: Duty ratio Pa1=48%, Pa2=53%
  First comparative example: Duty ratio Pa1=Pa2=48%
Other simulation conditions are the same as those of the simulation 1.

Figure 7A:
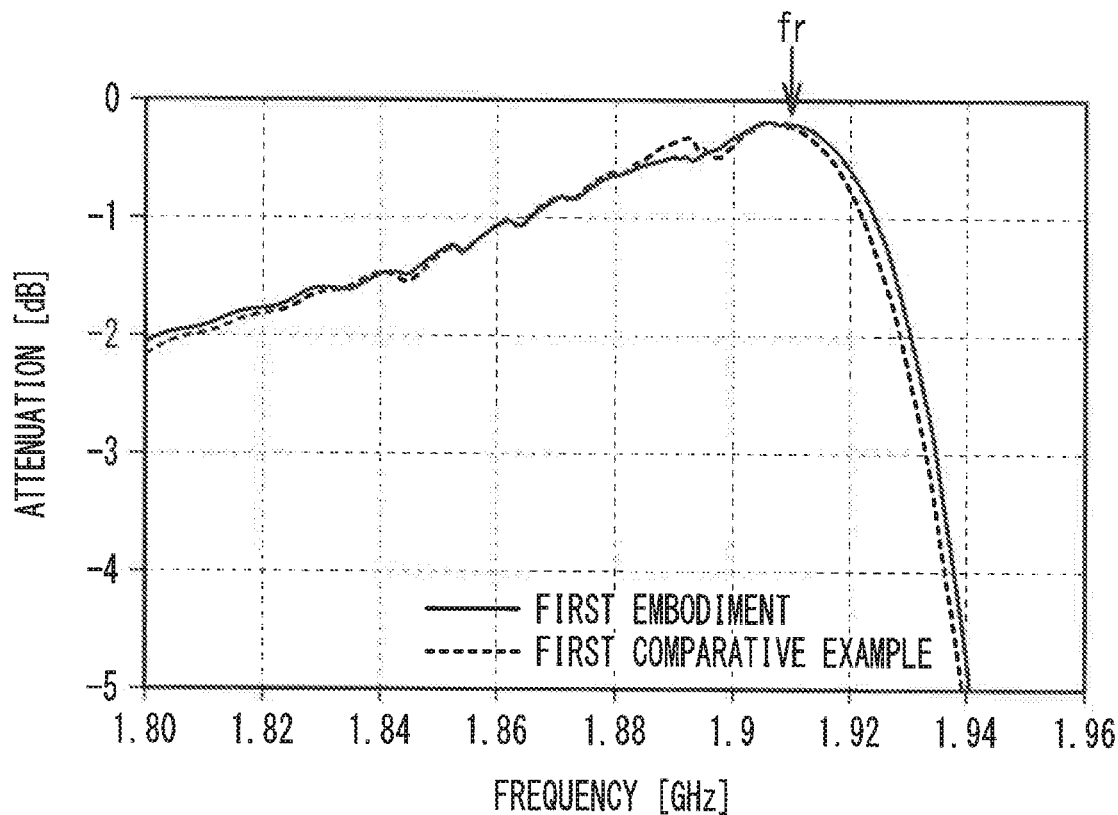
FIG. 7A and FIG. 7B illustrate transmission characteristics of filters in accordance with the first embodiment and a first comparative example.
Figure 7B:
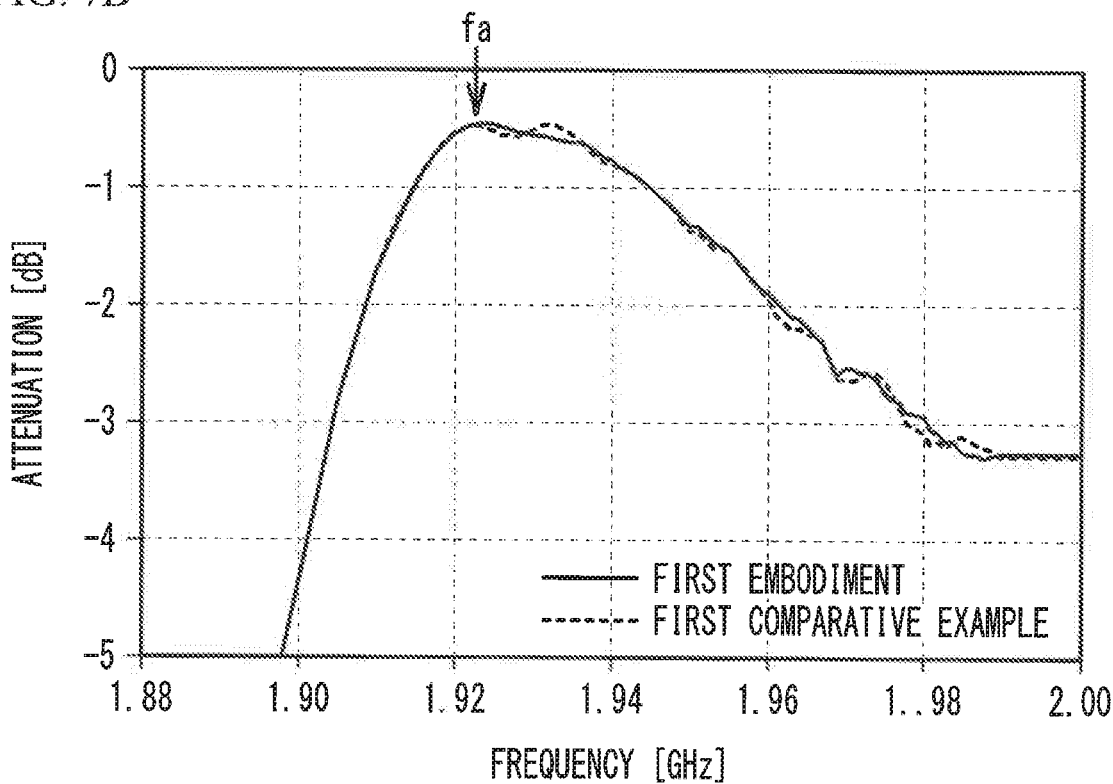

FIG. 7A and FIG. 7B illustrate transmission characteristics of the filters in accordance with the first embodiment and the first comparative example. As illustrated in FIG. 7A, spurious emissions are formed in the frequency band lower than the resonant frequency fr. In the first embodiment, spurious emissions are smaller than those in the first comparative example. As illustrated in FIG. 7B, spurious emissions are formed in the frequency band higher than the antiresonant frequency fa. In the first embodiment, spurious emissions are smaller than those in the first comparative example.

In the first embodiment, the acoustic wave resonator R1 (a first acoustic wave resonator) includes a pair of reflectors 20 (first reflectors) including the grating electrodes 16 (first grating electrodes), and a pair of the comb-shaped electrodes 18 (first comb-shaped electrodes) that is located between the pair of the reflectors 20 and includes a plurality of the electrode fingers 14 (first electrode fingers). The acoustic wave resonator R2 (a second acoustic wave resonator) includes a pair of the reflectors 20 (second reflectors) including the grating electrodes 16 (second grating electrodes), and a pair of the comb-shaped electrodes 18 (second comb-shaped electrodes) that is located between the pair of the reflectors 20 and includes a plurality of the electrode fingers 14 (second electrode fingers). The acoustic wave resonator R2 is connected in series with or connected in parallel with the acoustic wave resonator R1.

In the above-described structure, the average duty ratio Pa2 (i.e., the average value of the duty ratios) of the grating electrodes 16 of the acoustic wave resonator R2 differs from the average duty ratio Pa1 (i.e., the average value of the duty ratios) of the grating electrodes 16 of the acoustic wave resonator R1. This configuration reduces spurious emissions.

When the resonant frequencies of the acoustic wave resonators R1 and R2 are different from each other, the transmission characteristics other than spurious emissions become different. Thus, the average pitch Db2 (i.e., the average value of the pitches) of the electrode fingers 14 of the acoustic wave resonator R2 is configured to be substantially equal to the average pitch Db1 (i.e., the average value of the pitches) of the electrode fingers 14 of the acoustic wave resonator R1. This configuration allows the resonant frequencies of the acoustic wave resonators R1 and R2 to be substantially equal. The antiresonant frequencies of the acoustic wave resonators R1 and R2 are preferably substantially equal.

The average pitch Db of the electrode fingers 14 is calculated by dividing the width in the X direction of the IDT 24 by the number of the electrode fingers 14. The average duty ratio Pa of the grating electrodes 16 is calculated by dividing the sum of the widths Wa in the X direction of the grating electrodes 16 of the reflector 20 by the width in the X direction of the reflector 20.

"The average pitches Db1 and Db2 are substantially equal" means that the average pitches Db1 and Db2 are substantially equal to the extent that effect of reducing a spurious emission is achieved, and, for example, $|Db1-Db2| \leq 0.005(Db1+Db2)$.

"The resonant frequencies of the acoustic wave resonators R1 and R2 are substantially equal" means that the resonant frequencies of the acoustic wave resonators R1 and R2 are substantially equal to the extent that effect of reducing a spurious emission is achieved. For example, the difference in resonant frequency between the acoustic wave resonators R1 and R2 is preferably equal to or less than 1% of the average of the resonant frequencies of the acoustic wave resonators R1 and R2.

Provided is the support substrate 10b that is bonded on an opposite surface of the piezoelectric substrate 10a from the surface on which the acoustic wave resonators R1 and R2 are located. In this case, a spurious emission due to the bulk wave is reduced. Spurious due to the bulk wave is large when the thickness of the piezoelectric substrate 10a is equal to or less than 20λ (i.e., 40 times the pitches Db1 and Db2 in the IDTs 24). Thus, the duty ratios Pa1 and Pa2 are preferably configured to differ between the acoustic wave resonators R1 and R2. The thickness of the piezoelectric substrate 10a may be equal to or less than 10λ, or may be equal to or less than 1λ. The thickness of the piezoelectric substrate 10a may be equal to or greater than 0.1λ, or may be equal to or greater than 0.2λ.

When the piezoelectric substrate 10a is a 36° to 48° rotated Y-cut X-propagation lithium tantalite substrate, the acoustic wave excited by the EDT 24 becomes mainly a shear horizontal (SH) wave. In this case, the bulk wave is likely to be excited. Thus, it is preferable to configure Pa1 and Pa2 to be different.

The substrate 10 does not necessarily include the support substrate 10b, and may be the piezoelectric substrate 10a. In this case, a spurious emission due to the bulk wave is small. However, a spurious emission due to other unnecessary waves is reduced by configuring Pa1 and Pa2 to be different.

The average pitches Da1 and Da2 of the grating electrodes 16 of the acoustic wave resonators R1 and R2 are substantially equal. This configuration reduces a spurious emission. "The average pitches Da1 and Da2 are substantially equal" means that the average pitches Da1 and Da2 are substantially equal to the extent that effect of reducing a spurious emission is achieved, and, for example, |Da1−Da2|≤0.005(Da1+Da2).

The pitches of the grating electrodes 16 of the acoustic wave resonator R1 are preferably substantially equal, and the pitches of the grating electrodes 16 of the acoustic wave resonator R2 are preferably substantially equal. This configuration reduces a spurious emission, "The average pitches Da1 and Da2 are substantially equal" means that the average pitches Da1 and Da2 are substantially equal to the extent that effect of reducing a spurious emission is achieved, and means, for example, that the difference between the maximum value and the minimum value of the pitches of the grating electrodes 16 in the reflector 20 is less than |Da1−Da2|. For example, the difference between the maximum value and the minimum value of the pitches of the grating electrodes 16 is equal to or less than |Pa1−Da2|/2, or is equal to or less than |Da1−Da2|/10.

When the difference between the average duty ratios Pa1 and Pa2 is too large as illustrated in FIG. 6A, a spurious emission changes by one period or more. In addition, the difference in the Q-value becomes large as illustrated in FIG. 6B. Thus, the difference between the average duty ratios Pa1 and Pa2|Pa1−Pa2| is preferably 20% or less, more preferably 10% or less.

When the difference between the average duty ratios Pa1 and Pa2 is too small, effect of reducing a spurious emission is diminished. Thus, the difference between the average duty ratios Pa1 and Pa2 is preferably 1% or greater, more preferably 2% or greater.

The duty ratios Pa1 and Pa2 are preferably 30% or greater and 70% or less, more preferably 40% or greater and 60% or less.

The number of the grating electrodes 16 of the reflector 20 is preferably substantially the same between the acoustic wave resonators R1 and R2, and the number of the electrode fingers 14 of the IDT 24 is preferably substantially the same between the acoustic wave resonators R1 and R2. For example, the number of the grating electrodes 16 is preferably the same between the acoustic wave resonators R1 and R2 within a range of approximately ±10%, and the number of the electrode fingers 14 is preferably the same between the acoustic wave resonators R1 and R2 within a range of ±10%.

Second Embodiment

A second embodiment is an exemplary ladder-type filter. FIG. 8A through FIG. 8D are circuit diagrams of ladder-type filters in accordance with the second embodiment and first through third variations of the second embodiment, respectively. As illustrated in FIG. 8A through FIG. 8D, between the input terminal T1 and the output terminal T2, one or more series resonators S1 through S4 are connected in series, and one or more parallel resonators P1 through P4 are connected in parallel. The number of the series resonators and the number of the parallel resonators can be freely selected.

Figure 8A:
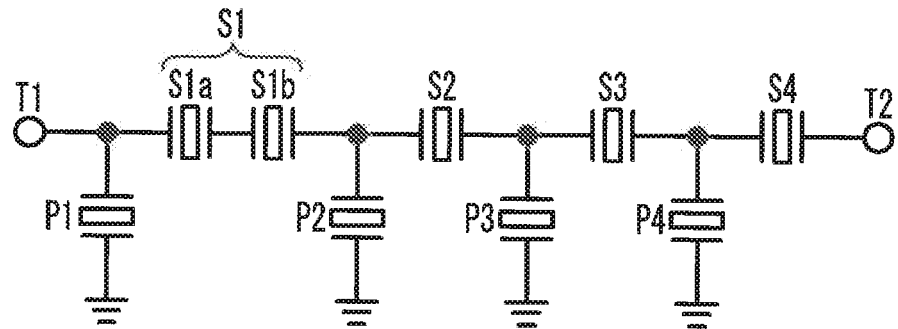
FIG. 8A through FIG. 8D are circuit diagrams of ladder-type filters in accordance with a second embodiment and first through third variations of the second embodiment, respectively.

As illustrated in FIG. 8A, in the second embodiment, in at least one series resonator S1, a plurality of series resonators S1a and S1b is connected in series. The series resonators S1a and S1b are configured to be the acoustic wave resonators R1 and R2, respectively. This configuration reduces a spurious emission.

Figure 8B:
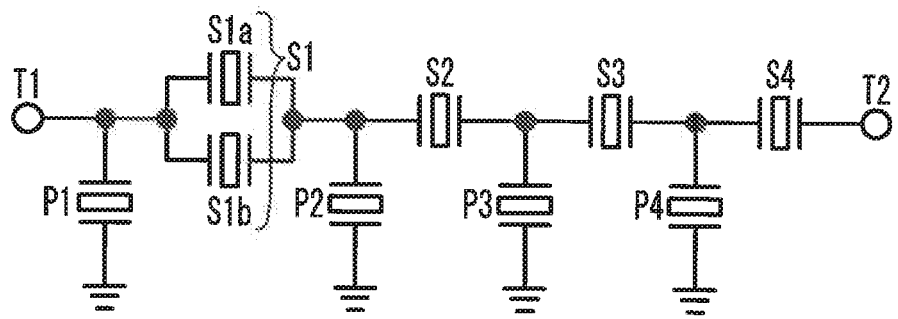

As illustrated in FIG. 8B, in the first variation of the second embodiment, in at least one series resonator S1, a plurality of series resonators Sla and Sib is connected in parallel. The series resonators S1a and S1b are configured to be the acoustic wave resonators R1 and R2, respectively. This configuration reduces a spurious emission.

Figure 8C:
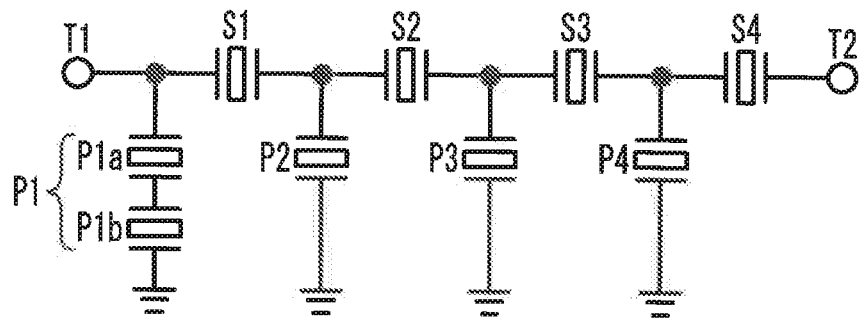

As illustrated in FIG. 8C, in the second variation of the second embodiment, in at (east one parallel resonator P1, a plurality of parallel resonators P1a and P1b is connected in series. The parallel resonators P1a and P1b are configured to be the acoustic wave resonators R1 and R2, respectively. This configuration reduces a spurious emission.

Figure 8D:
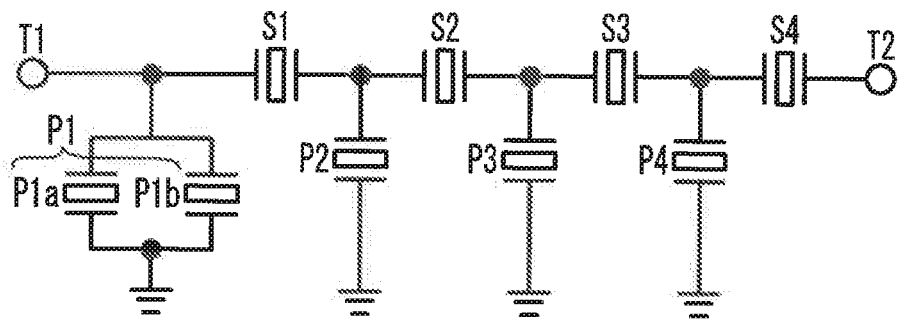

As illustrated in FIG. 8D, in the third variation of the second embodiment, in at least one parallel resonator P1, a plurality of parallel resonators P1a and P1b is connected in parallel. The parallel resonators P1a and P1b are configured to be the acoustic wave resonators R1 and R2, respectively. This configuration reduces a spurious emission.

In the second embodiment and the variations thereof, one resonator of the series resonators S1 through S4 and the parallel resonators P1 through P4 is composed of a plurality of the acoustic wave resonators R1 and R2 connected in series or connected in parallel, but it is sufficient if at least one resonator of the series resonators S1 through S4 and the parallel resonators P1 through P4 is composed of a plurality of the acoustic wave resonators R1 and R2 connected in series or connected in parallel.

As in the second embodiment, the acoustic wave resonators R1 and R2 are the series resonators S1a and Sib connected in series, and the parallel resonators P1 through P4 are not connected between the series resonators S1a and S1b. This structure is equivalent to the structure in which the series resonator S1 is divided in series into the series resonators S1a and S1b. As described above, a spurious emission is reduced by dividing the series resonator S1 of the ladder-type filter in series and configuring the duty ratio in the reflector 20 to be different between the series resonators S1a and S1b.

As in the third variation of the second embodiment, the acoustic wave resonators R1 and R2 are the parallel resonators P1a and P1b connected in parallel, and the series resonators S1 through S4 are not connected between the parallel resonators P1a and P1b. This structure is equivalent to the structure in which the parallel resonator P1 is divided in parallel into the parallel resonators P1a and P1b. As described above, a spurious emission is reduced by dividing the parallel resonator P1 of the ladder-type filter in parallel and configuring the duty ratio in the reflector 20 to be different between the parallel resonators P1a and P1b.

Figure 9A:
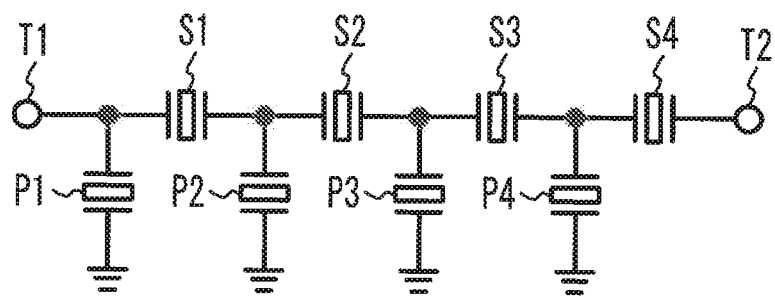
FIG. 9A is a circuit diagram of a filter in accordance with a fourth variation of the second embodiment.

FIG. 9A is a circuit diagram of a filter in accordance with a fourth variation of the second embodiment. As illustrated in FIG. 9A, two series resonators of one or more series resonators S1 through S4 may be the acoustic wave resonators R1 and R2 connected in series. Two parallel resonators of one or more parallel resonators P1 through P4 may be the acoustic wave resonators R1 and R2 connected in parallel. This configuration reduces a spurious emission.

Figure 9B:
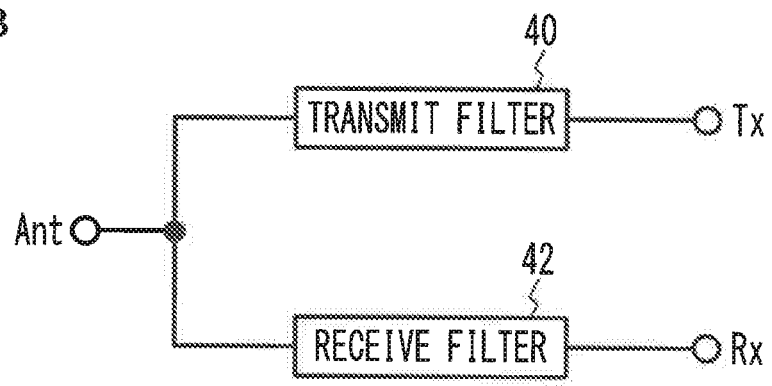
FIG. 9B is a circuit diagram of a duplexer in accordance with a fifth variation of the second embodiment.

FIG. 9B is a circuit diagram of a duplexer in accordance with a fifth variation of the second embodiment. As illustrated in FIG. 9B, a transmit filter 40 is connected between a common terminal Ant and a transmit terminal Tx. A receive filter 42 is connected between the common terminal Ant and a receive terminal Rx. The transmit filter 40 transmits signals in the transmit band to the common terminal Ant as transmission signals among signals input from the transmit terminal Tx, and suppresses signals with other frequencies. The receive filter 42 transmits signals in the receive band to the receive terminal Rx as reception signals among signals input from the common terminal Ant, and suppresses signals with other frequencies. At least one of the transmit filter 40 and the receive filter 42 may be the filter of the second embodiment. A high-frequency signal with large electrical power is applied to the transmit filter 40. Thus, it is preferable to use the filter of the second embodiment for the transmit filter 40.

A case where the multiplexer is a duplexer has been described as an example, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. A filter comprising:
a piezoelectric substrate;
a first acoustic wave resonator that is located on the piezoelectric substrate and includes a pair of first reflectors and a pair of first comb-shaped electrodes, the pair of first reflectors including a plurality of first grating electrodes, the pair of first comb-shaped electrodes being located between the pair of first reflectors and including a plurality of first electrode fingers; and
a second acoustic wave resonator that is connected in series with or connected in parallel with the first acoustic wave resonator, is located on the piezoelectric substrate, and includes a pair of second reflectors and a pair of second comb-shaped electrodes, the pair of second reflectors including a plurality of second grating electrodes, an average value of duty ratios of the plurality of second grating electrodes being different from an average value of duty ratios of the plurality of first grating electrodes, the pair of second comb-shaped electrodes being located between the pair of second reflectors and including a plurality of second electrode fingers, an average value of pitches of the plurality of second electrode fingers being substantially equal to an average value of pitches of the plurality of first electrode fingers.

2. The filter according to claim 1, wherein
the average value of pitches of the plurality of first grating electrodes is substantially equal to the average value of pitches of the plurality of second grating electrodes.

3. The filter according to claim 1, wherein
a difference between the average value of the duty ratios of the plurality of first grating electrodes and the average value of the duty ratios of the plurality of second grating electrodes is 1% or greater and 20% or less.

4. The filter according to claim 1, wherein
the first acoustic wave resonator and the second acoustic wave resonator are connected in series.

5. The filter according to claim 1, wherein
the first acoustic wave resonator and the second acoustic wave resonator are connected in parallel.

6. The filter according to claim 1, wherein
a resonant frequency of the first acoustic wave resonator and a resonant frequency of the second acoustic wave resonator are substantially equal.

7. The filter according to claim 1, further comprising:
a plurality of series resonators connected in series between an input terminal and an output terminal; and
one or more parallel resonators connected in parallel between the input terminal and the output terminal, wherein
the series resonators include the first acoustic wave resonator and the second acoustic wave resonator, the first acoustic wave resonator and the second acoustic wave resonator are connected in series, and no parallel resonator is connected between the first acoustic wave resonator and the second acoustic wave resonator.

8. The filter according to claim 1, further comprising:
one or more series resonators connected in series between an input terminal and an output terminal; and
a plurality of parallel resonators connected in parallel between the input terminal and the output terminal, wherein
the parallel resonators include the first acoustic wave resonator and the second acoustic wave resonator, the first acoustic wave resonator and the second acoustic wave resonator are connected in parallel, and no series resonator is connected between the first acoustic wave resonator and the second acoustic wave resonator.

9. The filter according to claim 1, further comprising a support substrate that is bonded on an opposite surface of the piezoelectric substrate from a surface on which the first acoustic wave resonator and the second acoustic wave resonator are located.

10. A multiplexer comprising:
a filter including:
a piezoelectric substrate;
a first acoustic wave resonator that is located on the piezoelectric substrate and includes a pair of first reflectors and a pair of first comb-shaped electrodes, the pair of first reflectors including a plurality of first grating electrodes, the pair of first comb-shaped electrodes being located between the pair of first reflectors and including a plurality of first electrode fingers; and
a second acoustic wave resonator that is connected in series with or connected in parallel with the first acoustic wave resonator, is located on the piezoelectric substrate, and includes a pair of second reflectors and a pair of second comb-shaped electrodes, the pair of second reflectors including a plurality of second grating electrodes, an average value of duty ratios of the plurality of second grating electrodes being different from an average value of duty ratios of the plurality of first grating electrodes, the pair of second comb-shaped electrodes being located between the pair of second reflectors and including a plurality of second electrode fingers, an average value of pitches of the plurality of second electrode fingers being substantially equal to an average value of pitches of the plurality of first electrode fingers.

\* \* \* \* \*